United States Patent [19]
Li et al.

[11] Patent Number: 5,277,985
[45] Date of Patent: Jan. 11, 1994

[54] PROCESS FOR FABRICATING COPPER INTERCONNECTS IN ULTRA LARGE SCALE INTEGRATED (ULSI) CIRCUITS

[75] Inventors: Jian Li, Ithaca; Evan Colgan, Suffern; James W. Mayer, Ithaca, all of N.Y.

[73] Assignees: Cornell Research Foundation, Ithaca; International Business Machines, Corporation, Armonk, both of N.Y.

[21] Appl. No.: 790,971

[22] Filed: Nov. 12, 1991

[51] Int. Cl.$^5$ .................................. B32B 9/00
[52] U.S. Cl. ...................... 428/432; 428/433; 428/688; 428/209
[58] Field of Search ............ 428/432, 433, 688, 209

[56] References Cited

U.S. PATENT DOCUMENTS

| | | | |
|---|---|---|---|
| 4,151,325 | 4/1979 | Welch | 428/432 |
| 4,546,050 | 10/1985 | Amberger et al. | 428/667 |
| 4,570,328 | 2/1986 | Price et al. | 29/571 |
| 4,690,871 | 9/1987 | Gordon | 428/432 |

OTHER PUBLICATIONS

K. Hoshino et al. "Copper Interconnects for ULSI Applications".
Donald Gardner et al. "Encapsulated Copper Interconnection Devices Using Sidewall Barriers", Jun. 11-12, 1991 VMIC Conference.

*Primary Examiner*—Patrick J. Ryan
*Assistant Examiner*—Cathy K. Lee
*Attorney, Agent, or Firm*—Salzman & Levy

[57] ABSTRACT

The present invention features low-temperature, self-encapsulated, copper interconnect lines on silicon substrates of Ultra-Large Scale Integration (ULSI) circuits. The interconnect lines are a product of a process that includes the following steps: (a) alloying the copper with titanium in an approximate 10 atomic weight percentage of titanium; (b) depositing a layer of the copper/titanium alloy upon a silicon dioxide/silicon substrate of a ULSI circuit; (c) patterning the copper/titanium layer to form interconnect lines on the substrate; (d) forming a titanium rich surface film on the copper interconnect lines by rapid heating of the copper/titanium interconnect lines at an approximate ramping rate of between 60° and 80° C./minute; and (e) nitriding the titanium rich surface of the interconnect lines in an ammonia atmosphere at low temperatures in an approximate range of between 450° to 650° C. for about 15 to 40 minutes, to form a titanium nitride encapsulating layer about said copper interconnect lines.

5 Claims, 2 Drawing Sheets

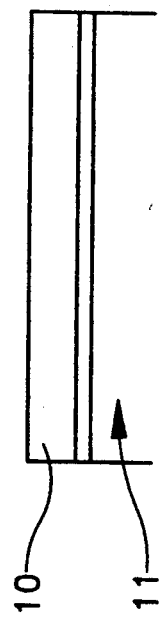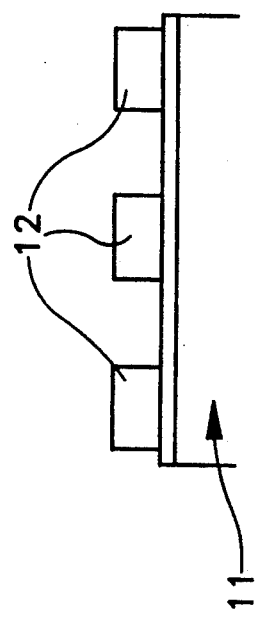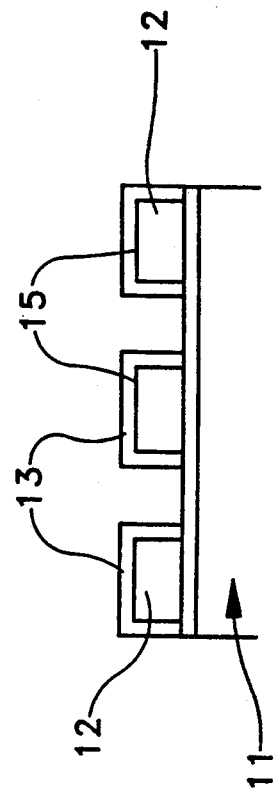

PROCESS FOR FABRICATING COPPER INTERCONNECTS IN ULTRA LARGE SCALE INTEGRATED (ULSI) CIRCUITS

FIELD OF THE INVENTION

The invention pertains to Ultra Large Scale Integrated circuits, and more particularly to a process for fabricating copper interconnects in Ultra Large Scale Integrated Circuits utilizing a self-encapsulating, low-temperature technique.

BACKGROUND OF THE INVENTION

The fabrication of deep submicron Ultra-Large Scale Integrated (ULSI) circuits requires long interconnects having small contacts and small cross-sections. Copper is preferred over aluminum as the conductive element.

Many problems, however, are encountered in fabricating circuit interconnects with copper. Some of the major difficulties include: (a) the rapid diffusion of the copper to the silicon and silicon dioxide of the base; (b) the susceptibility of the copper to oxidize during interconnection fabrication; and (c) the poor adhesive characteristics of copper with dielectric films.

Barrier layers have been used to avoid the aforementioned problems. A layer of titanium nitride (TiN) has been suggested as a possible diffusion barrier due to its inert and conductive nature.

Although reactive sputtering is a common method of generating titanium nitride layers, this method provides very poor step coverage. In multi-level metallization processes utilizing copper, film conformality is critical. This is especially so for high aspect ratio contact, or with the use of holes.

Low Pressure Chemical Vapor Deposition (LPCVD) can provide the titanium nitride films with conformality approaching 100%, as taught by U.S. Pat. No. 4,570,328, issued to Price et al. Unfortunately the titanium nitride film produced by this process has a high resistivity resulting from the residual chlorine within the film.

More recently, it has been proposed to provide a conductive and conformal barrier layer for the copper, by a self-encapsulating process. An anisotropic etching technique using molybdenum has been proposed to encapsulate the copper. D. Gardner et al, IEEE V-MIC, 99 (1991).

Still another proposed process suggests alloying the copper with titanium, and then annealing it in a nitrogen atmosphere at 800° C. The high temperature annealing will chemically form a titanium nitride layer on the copper surface. K. Hosino et al, IEEE V-MIC, 226 (1989). This high temperature technique, however, is not practical for many applications.

The present invention is for a low temperature, self-encapsulating method of producing the copper interconnects in ULSI circuits.

The self-encapsulating process of the invention is characterized by three distinctive steps:

(a) alloying the copper with titanium for deposit as interconnect lines upon the substrate;

(b) after depositing the interconnect lines on the substrate, utilizing a fast heating rate to anneal the lines, so that surface diffusion dominates over internal nucleation, thus providing a surface rich in titanium; and (c) utilizing an annealing ambient of ammonia below approximately 650° C., to provide chemical formation of the titanium nitride film about the copper interconnect lines.

The critical step in the above-mentioned process is the heating rate of the copper/titanium alloy. The heating ramp which controls the quality of the resulting titanium nitride surface must be approximately between 60° to 80° C./minute, or higher.

The resulting titanium nitride film completely encapsulates the copper interconnect lines and exhibits good adhering properties to the copper. The encapsulating film also has resistance stability after in situ oxidation in air at 200° C.

SUMMARY OF THE INVENTION

In accordance with the present invention, there are provided low-temperature, self-encapsulated, copper interconnect lines on silicon substrates of Ultra-Large Scale Integration (ULSI) circuits. The interconnect lines are a product of a process that includes the following steps: (a) alloying the copper with titanium in an approximate 10 atomic weight percentage of titanium; (b) depositing a layer of the copper/titanium alloy upon a silicon dioxide/silicon substrate of a ULSI circuit; (c) patterning the copper/titanium layer to form interconnect lines on the substrate; (d) forming a titanium rich surface film on the copper interconnect lines by rapid heating of the copper/titanium interconnect lines at an approximate ramping rate of between 60° and 80° C./minute; and (e) nitriding the titanium rich surface of the interconnect lines in an ammonia atmosphere at low temperatures in an approximate range of between 450° to 650° C. for about 15 to 40 minutes, to form a titanium nitride encapsulating layer about said copper interconnect lines. The patterning of the interconnect lines can be accomplished by a liftoff technique providing interconnect lines that are approximately 0.5 microns wide, and that are spaced apart by approximately 2 microns. The titanium nitride encapsulating layer can be approximately between 40 to 50 nm. The deposited copper/titanium alloy is approximately 300 nm in thickness and can be deposited by a sputtering technique or by an electron beam co-evaporation technique at an approximate pressure of $10^{-7}$ torr.

BRIEF DESCRIPTION OF THE DRAWINGS

A complete understanding of the present invention may be obtained by reference to the accompanying drawings, when considered in conjunction with the subsequent detailed description, in which:

FIG. 1 illustrates a schematic cross-section of a ULSI circuit substrate having a deposited layer of copper/titanium alloy upon its surface;

FIG. 2 depicts the substrate of FIG. 1, after the layer has been patterned to produce interconnect lines;

FIG. 3 shows the patterned layer of FIG. 2, after the interconnect lines have undergone nitriding.

For the sake of brevity and clarity, the same elements and components will bear the same designation throughout the figures.

DESCRIPTION OF THE PREFERRED EMBODIMENT

Figure 4:
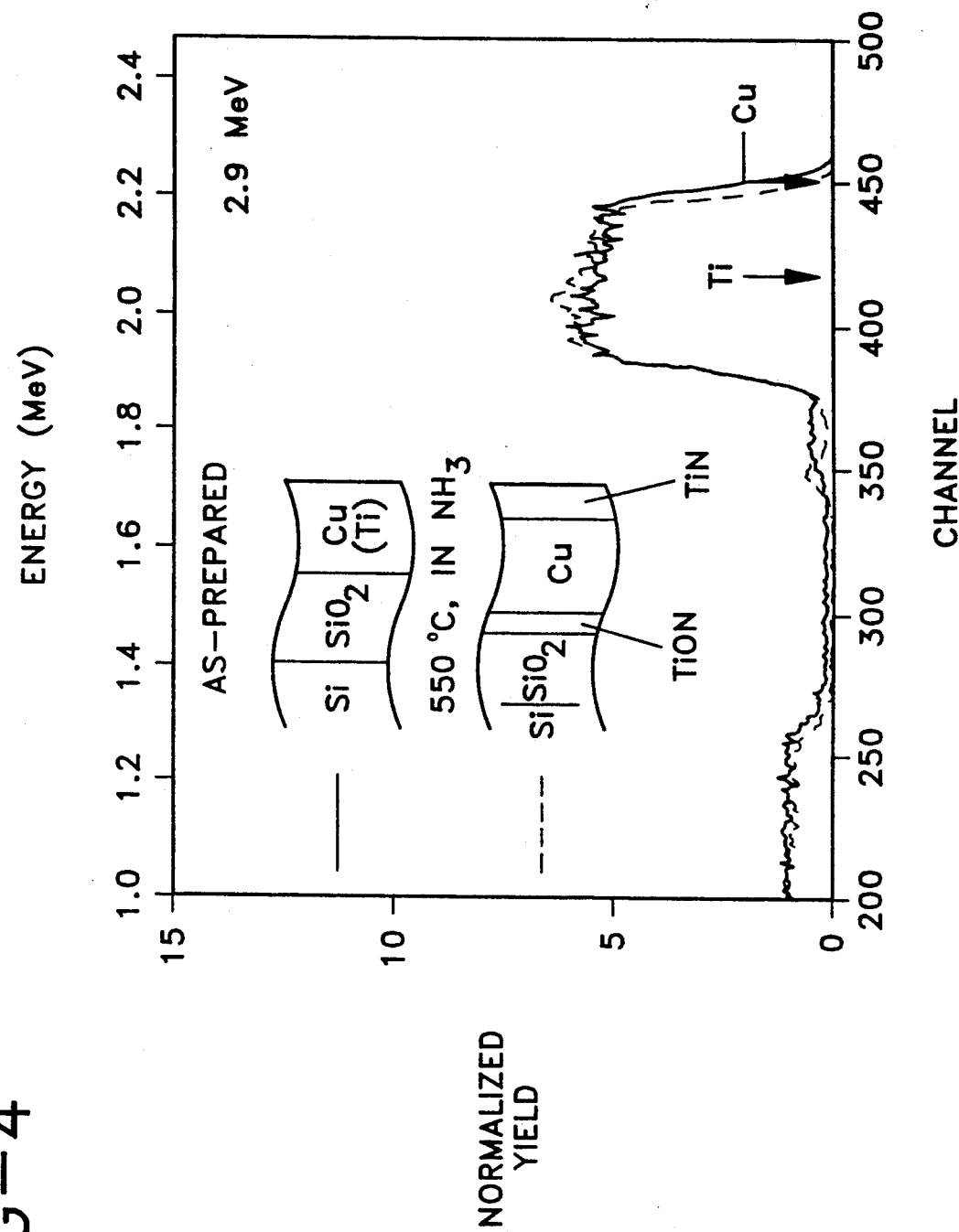
FIG. 4 illustrates a graph produced by Rutherford backscattering spectrometry, showing the composition and film thickness of the interconnect lines upon a silicon/silicon dioxide substrate produced in accordance with the invention.

Generally speaking, the invention uses copper as the material for the interconnect lines of a ULSI circuit. Copper was chosen over aluminum for its low bulk electrical resistivity (50% lower than aluminum), and its higher melting temperature (1083° C. versus 600° C.). Copper also exhibits a high electromigration resistance, which greatly improves the reliability of the interconnect lines to function properly in the circuit.

However, copper is a difficult material for fabricating the interconnect lines, since it reacts with silicon, silicides, aluminum and aluminides at temperatures as low as 150° C., and it oxidizes in air at similar temperatures.

If copper is to be used successfully in the ULSI circuit, conformal layers, also referred to as diffusion barriers, are required to prevent the copper from interacting with surrounding materials.

The invention reflects the discovery that copper can be encapsulated with a titanium nitride film. This film is used to encapsulate the copper interconnect lines. The interconnect lines of the ULSI circuit exhibit improved thermal stability, higher oxidation resistance, low electrical resistance, and a favorable electromigration lifetime.

The copper interconnect lines are formed upon the ULSI substrate by a low temperature process that greatly reduces the cost of their fabrication. The first step in the process is to prepare a copper/titanium alloy, generally featuring a 10 atomic weight percentage of titanium. A layer 10 of this Cu/Ti alloy is then deposited upon a silicon dioxide/silicon (100) substrate 11 of the ULSI circuit, as shown in FIG. 1. It should be understood that, although silicon dioxide/silicon substrates are described herein for purposes of illustration, other substrate compositions may be used without departing from the scope of the present invention. The Cu/Ti layer 10 can be deposited by a smuttering technique or by an electron-beam co-evaporation process at a pressure of approximately $10^{-7}$ torr.

After the copper/titanium layer is deposited, the interconnect lines 12 are patterned in the CU/TI layer by a liftoff process. A general pattern of interconnect lines can be produced having 0.5 micron width, and 2 micron spacing, as depicted in FIG. 2.

Next, the interconnect lines 12 are encapsulated by a nitride layer 13, as illustrated in FIG. 3. The interconnect lines 12 are rapidly annealed at a ramped heating rate, generally between 60° and 80° C./minute, and preferably at about 70° C./minute. The rapid heating rate allows the titanium to diffuse to the surface. A fast heating rate for annealing the lines assures that diffusion dominates over internal nucleation, thus providing a surface rich in titanium. This titanium rich surface is then nitrided by heating the interconnect lines 12 in an ammonia ($NH_3$) ambient at a temperature in the range of between 450° to 650° C. for between 15 to 40 minutes. Preferably, the interconnect lines 12 are heated at 550° C., for about 20 to 30 minutes.

Diffusion of the titanium can be visually observed by the change of color of the interconnect lines 12 from silver to gold. The formation of $Cu_3Ti$ competes with Ti upon nitridation.

The composition and film thickness (300 nm) were measured by Rutherford backscattering spectrometry, which produced the graph shown in FIG. 4. Based upon the simulation of the RBS spectra, a thin layer of TiN with thickness of 40 nm formed near the surface 15 of the interconnect lines 12. The titanium segregated at the copper/silicon dioxide interface. The adhesion between the interconnect lines 12 and substrate 11 has been improved with the addition of the nitride layer 13.

It should be observed that the self-encapsulating TiN layer may act as a diffusion ion barrier, for example, between Cu and a polyimide film.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented by the subsequently appended claims.

What is claimed is:

1. A product by process comprising low-temperature, self-encapsulated, copper interconnect lines on substrates of Ultra-Large Scale Integration (ULSI) circuits, the interconnect lines of said ultra-large scale integrated (ULSI) circuits having a titanium nitride film defined by the process comprising the steps of:
   (a) alloying copper with titanium to provide a material for forming interconnect lines upon a substrate;
   (b) forming said interconnect lines upon said substrate;
   (c) after forming the interconnect lines on the substrate, utilizing a fast heating rate of greater than 50° C./minute, to anneal the interconnect lines so that surface diffusion dominates over internal nucleation, thus providing a surface rich in titanium upon said interconnect lines; and
   (c) utilizing an annealing ambient of ammonia below approximately 650° C., to provide chemical formation of a titanium nitride film about said interconnect lines.

2. The product by process in accordance with claim 1, wherein said chemical formation of step (d) is accomplished using an ammonia atmosphere at an approximate temperature of 550° C.

3. The product by process in accordance with claim 1, wherein said step (c) of providing a titanium rich surface film includes heating said interconnect lines and said substrate at an approximate ramping rate of between 60° and 80° C./minute.

4. The product by process in accordance with claim 3, wherein said ramping rate is approximately 70° C./minute.

5. The product by process in accordance with claim 1, wherein said alloying step (a) alloys said copper with titanium in an approximate 10 atomic weight percentage of titanium.

* * * * *